(12) United States Patent
Dohi et al.

(10) Patent No.: US 7,989,073 B2
(45) Date of Patent: Aug. 2, 2011

(54) EPITAXIAL SILICON WAFER AND FABRICATION METHOD THEREOF

(75) Inventors: Takayuki Dohi, Tokyo (JP); Shinji Nakahara, Tokyo (JP); Masaya Sakurai, Tokyo (JP); Masato Sakai, Tokyo (JP)

(73) Assignee: Sumco Corporation (JP)

( * ) Notice: Subject to any disclaimer, the term of this patent is extended or adjusted under 35 U.S.C. 154(b) by 149 days.

(21) Appl. No.: 11/850,591

(22) Filed: Sep. 5, 2007

(65) Prior Publication Data

US 2008/0057323 A1 Mar. 6, 2008

(30) Foreign Application Priority Data

Sep. 5, 2006 (JP) ................... 2006-240866
Sep. 4, 2007 (JP) ................... 2007-228717

(51) Int. Cl.
*B32B 9/00* (2006.01)
(52) U.S. Cl. ........................................ 428/446
(58) Field of Classification Search .................. 428/446; 423/348
See application file for complete search history.

(56) References Cited

U.S. PATENT DOCUMENTS

| | | | | |
|---|---|---|---|---|
| 5,877,039 A * | 3/1999 | Tanizawa | ........................ | 438/53 |
| 2005/0217560 A1 | 10/2005 | Tolchinsky et al. | | |
| 2006/0068568 A1* | 3/2006 | Yanase | ........................ | 438/478 |
| 2006/0131553 A1* | 6/2006 | Yamanaka et al. | ................ | 257/1 |
| 2009/0084373 A1* | 4/2009 | Oishi | ............................... | 125/20 |
| 2009/0304994 A1* | 12/2009 | Daub et al. | .................... | 428/141 |

FOREIGN PATENT DOCUMENTS

| | | |
|---|---|---|
| EP | 1498516 | 1/2005 |
| EP | 159204 | 11/2005 |
| JP | 2001-253797 | * 9/2001 |
| JP | 2004-265918 A | 9/2004 |
| JP | 2005-039111 | 10/2005 |

OTHER PUBLICATIONS

Matsushita et al. "Precise Control of Annealed Wafer for Nanometer Devices", High Purity Silicon 9, 210$^{th}$ ECS meeting, vol. 4, Iss. 3, Oct. 2006, pp. 159-168.*

Yoshida et al., "Preparation of the atomically straight step edge Si(111) substrates as templates for nanostructure fabrication", Materials Research Society Symposium Proceedings. vol. 832, (2005), pp. F10.17.1-F10.17.6.*

(Continued)

*Primary Examiner* — Timothy M Speer
*Assistant Examiner* — Jonathan C Langman
(74) *Attorney, Agent, or Firm* — Kolisch Hartwell, P.C.

(57) ABSTRACT

An epitaxial silicon wafer is provided in which an epitaxial layer is grown on a silicon wafer having a plane inclined from a {110} plane of a silicon single crystal as a main surface. In the silicon wafer for growing the epitaxial layer thereon, an inclination angle azimuth of the {110} plane is in the range of 0 to 45 degrees as measured from a <100> orientation parallel to the {110} plane toward a <110 > direction. With such an arrangement, LPDs of 100 nm or less can be measured from a {110} wafer that has a carrier mobility (including the hole and electron mobilities) higher than that of a {100 } wafer. Also, surface roughness degradation in the {110} wafer can be suppressed. Also, the surface state of the {110} wafer can be measured. Further, a quality evaluation can be performed on the {110} wafer.

2 Claims, 6 Drawing Sheets

OTHER PUBLICATIONS

Korean Intellectual Property Office, "Notice of Preliminary Rejection" for Korean Application No. 10-2007-0089803, issued Feb. 19, 2009. This application is the Korean counterpart of U.S. Appl. No. 11/850,591.

European Search Report dated Dec. 17, 2010 in connection with corresponding European Patent Application No. 07017348.9-2203.

SEMI, "SEMI MF1241-95 (Reapproved 2000) Terminology of Silicon Technology", 2003, pp. 1-9.

Stanley Wolf, "Silicon Processing for the VLSI Era—vol. IV", "Chapter 2, 300-mm Silicon Wafers", May 1, 2002, pp. 17-74.

D. Dijkkamp et al., "Scanning tunneling microscopy study of Si (001) and Si (110) surface structures resulting from different thermal cleaning treatments", Journal of Vacuum Science & Technology, Jan./Feb. 1990, pp. 218-221.

\* cited by examiner

EPITAXIAL SILICON WAFER AND FABRICATION METHOD THEREOF

BACKGROUND OF THE INVENTION

1. Field of the Invention

The present invention relates to an epitaxial silicon wafer and a fabrication method thereof. More particularly, the present invention relates to a technique suitable for use in a silicon wafer having a plane inclined from a {110} plane as a main surface.

Priority is claimed on Japanese Patent Application No. 2006-240866, filed Sep. 5, 2006, and on Japanese Patent Application No. 2007-228717, filed Sep. 4, 2007, the content of which are incorporated herein by reference.

2. Description of the Related Art

In recent years, the feasibility of semiconductor integrated circuit devices has been increased in which a so-called {110} silicon wafer, in which a main surface is a {110} plane of a silicon single crystal or a plane in the vicinity of the {100} plane, is used. Such a {110} silicon wafer has a high probability of increasing a carrier mobility in the MOSFET channel direction compared to that obtainable from the conventional {100} wafer, and thus application of the {110} silicon wafer to logic devices is expected.

[Patent Document 1] JP-A-2004-265918

The epitaxial wafers having an epitaxial layer grown on the {110} silicon wafer has a problem in that the surface roughness after the epitaxial growth may be degraded compared to the epitaxial wafers having an epitaxial layer grown on the {100} wafer.

Such degradation in the surface roughness may result in degradation in the haze level measured by a surface inspection tool and thus has a substantial influence on the measurement values since the degraded surface roughness is treated as noise when measuring micro-size LPDs (light point defects) on the surface as required by high-precision products.

In view of the effect of the surface roughness on the noise, at the present moment, it is difficult to measure LPDs of 100 nm or less on the surface of the {110} epitaxial wafer at the time of wafer surface inspection. Thus, it is difficult to determine the surface state of the wafer, making it impossible to perform a quality evaluation on the wafer.

SUMMARY OF THE INVENTION

The present invention has been made in view of the circumstances described above.

An object of the present invention is to intend to improve the surface roughness in the {110} wafer.

According to a first aspect of the present invention, there is provided an epitaxial silicon wafer in which an epitaxial layer is grown on a silicon wafer having a plane inclined from a {110} plane of a silicon single crystal as a main surface, wherein in the silicon wafer for growing the epitaxial layer thereon, an inclination angle azimuth of the {110} plane is in the range of more than 0 degrees and not more than 45 degrees as measured from a <100> orientation parallel to the {110} plane toward a <110> direction.

Moreover, in the epitaxial silicon wafer according to the above aspect of the other present invention, it is preferable that an inclination angle of the {110} plane be in the range of more than 0 degrees and not more than 10 degrees as measured from the {110} plane.

Furthermore, in the epitaxial silicon wafer according to the above aspect of the other present invention, the least size of detected LPDs (light point defects) is 100 nm or less from the surface of the epitaxial silicon wafer using a laser-based surface inspection tool.

According to a second aspect of the present invention, there is provided a fabrication method of an epitaxial silicon wafer in which an epitaxial layer is grown on a silicon wafer having a plane inclined from a {110} plane of a silicon single crystal as a main surface, wherein the silicon wafer for growing the epitaxial layer is sliced from a pulled-up single crystal at such a slice angle that an inclination angle azimuth of the {110} plane is in the range of more than 0 degrees and not more than 45 degrees as measured from a <100> orientation parallel to the {110} plane toward a <110> direction.

In the fabrication method of an epitaxial silicon wafer according to the above aspect of the other present invention, the slice angle may be set such that an inclination angle of the {110} plane is in the range of more than 0 degrees and not more than 10 degrees as measured from the {110} plane.

If the inclination angle azimuth is greater than the upper limit, the surface roughness may increase thus making the laser-based surface inspection tool impossible to mea LPDs of 100 nm or less, and thus it is not desirable.

For example, the term "inclination angle azimuth" used in this specification is meant to include both-directional inclination in the range of more than 0 degrees and not more than 45 degrees as measured from the [001] orientation toward the <110> direction; that is, positive-directional inclination of that range as measured from the <100> orientation toward the [1-10] direction; and negative-directional inclination of that range as measured from the <100> orientation toward the [−110] direction.

It is preferable that the inclination angle azimuth of that range include 0 degrees but not 45 degrees. More preferably, the inclination angle azimuth of that range does not include 0 degrees and be set 20 degrees or less.

If the inclination angle azimuth is set to the <111> direction, which is higher than 30 degrees, the step difference (height) of a terrace suddenly increases and it is measured as haze, or surface roughness.

The inclination of the above angle enables not only to do LPDs measurement as a problem but also to gain good characteristics whatever MOSFET is formed.

In the present invention, it is preferable that the inclination angle of the {110} plane be in the range of 0 to 10 degrees as measured from the {110} plane. More preferably, the inclination angle is in the range of more than 0 to 10 degrees or less. With such an arrangement, it is possible to provide a narrow step spacing in the {110} plane and thus to achieve an epitaxial wafer having excellent flatness, possibility of measurement of LPDs, possibility of separated measurement of steps, particles and defects in surface.

When the inclination angle of the {110} plane becomes 10 degrees or more, it it not preferable because it seems that since a terrace width becomes smaller, a step is prevented from growing at an epitaxial process and a step is stably formed with more difficult at an epitaxial process.

If the inclination angle is set to 0 degrees, that is, just {110} plane, it is possible to get a flat surface since a step does not exist.

If the inclination angle is set to 10 degrees or more, it is not preferable. The reasons are that a terrace width becomes small compared to an atom layer step difference (0.192 nm), then preventing a step from growing and possibilities of occurrence of a different plane from {110} plane exist.

In the present invention, it is preferable that the surface of the epitaxial silicon wafer be measured using a laser-based surface inspection tool, the size of detected LPDs (limit detect value) be 100 nm or less, and LPDs of at least 100 nm or more detected. More preferably, the least size of detected LPDs (limit detect value) is 65 nm or less. Because LPDs of 65 nm or more can be detected, it becomes possible to determine the surface state of a wafer having an epitaxial layer grown thereon and thus to perform a quality evaluation on the wafer in an exact manner.

For a silicon wafer substrate on which MOSFET (Metal-Oxide-Semiconductor Field Effect Transistor) is fabricated, there has been used a wafer having a main surface having a {100} plane or an inclined plane with an off-angle of about 4 degrees against the {100} plane. As for MOSFET, as patent document 1 shows, it is known that the setting of an inclination angle azimuth of a wafer makes terraces and an improvement of mobility is shown in a parallel direction to a step.

In patent document 1, it is written that a roughness is reduced by epitaxial growth in a wafer inclining to <100> direction.

However, being different from patent document 1, for a good epitaxial wafer which is needed that it is possible to select particles, defects, and protuberances from roughness by LPDs measurement equipment after epitaxial growth and that it is possible to gain good characteristics in not only one but also all directions, wherein careers of electronics devices which is formed on a wafer flow, such as the present invention, it is preferable that epitaxial be growing on the substrate, of which an axis inclines in the range of 0 to 10 degrees to the direction, in which an inclination angle rotates from <100> direction to <110> direction in the range of 0 to 45 degrees.

Advantage of the Invention

According to the present invention, in the silicon wafer having a plane inclined from the {110} plane as a main surface, it is possible to obtain a good surface roughness level It becomes possible to measure micro-size LPDs of 100 nm or less, particularly of 65 nm or more, which were previously difficult or impossible to measure.

DETAILED DESCRIPTION OF THE INVENTION

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

First Embodiment

Hereinafter, an epitaxial silicon wafer and a fabrication method thereof according to a first embodiment of the present invention will be described with reference to the accompanying drawings.

Figure 1:
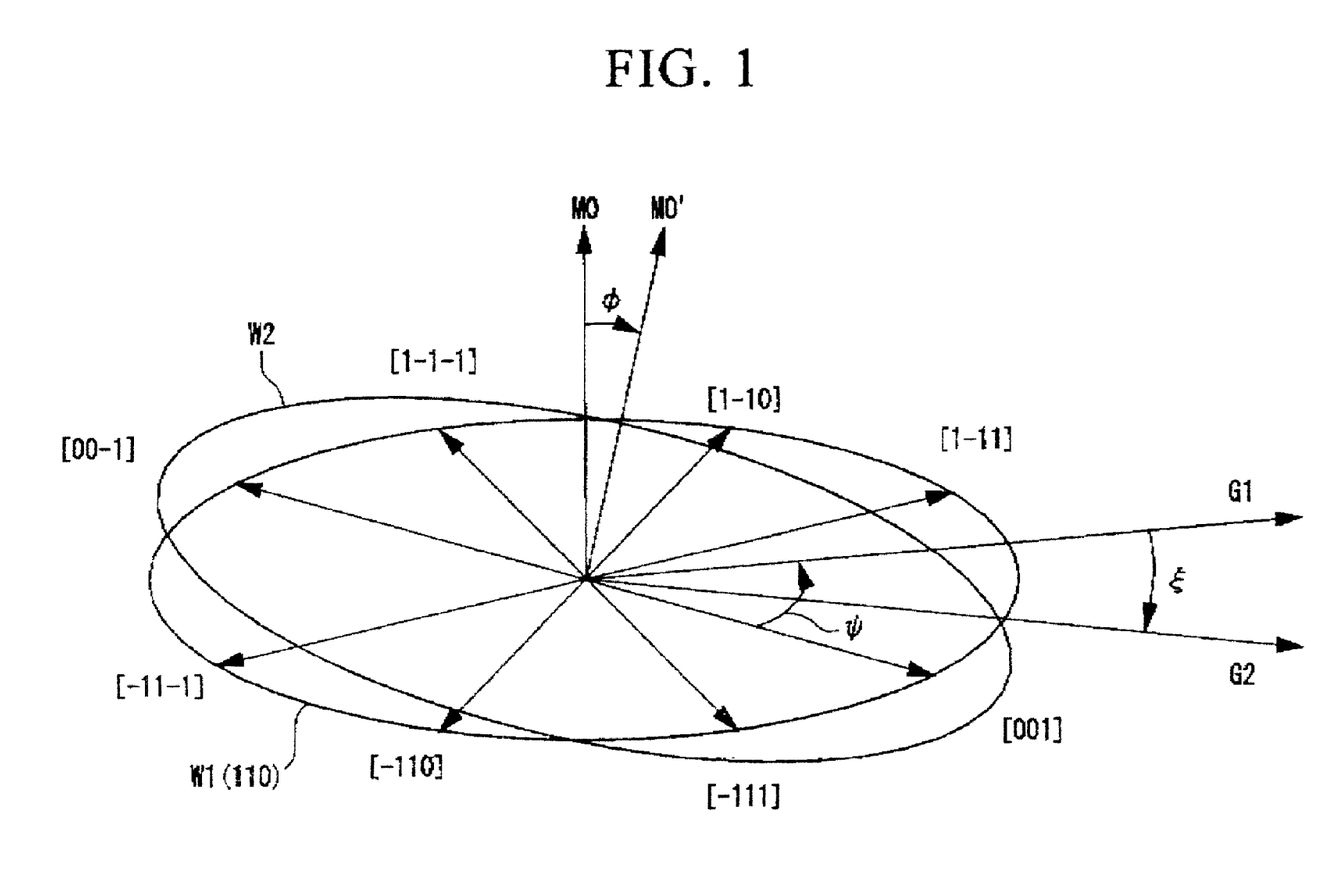
FIG. 1 is a schematic perspective view for explaining an inclination angle azimuth and an inclination angle of an epitaxial silicon wafer in accordance with a first embodiment of the invention.
Figure 2:
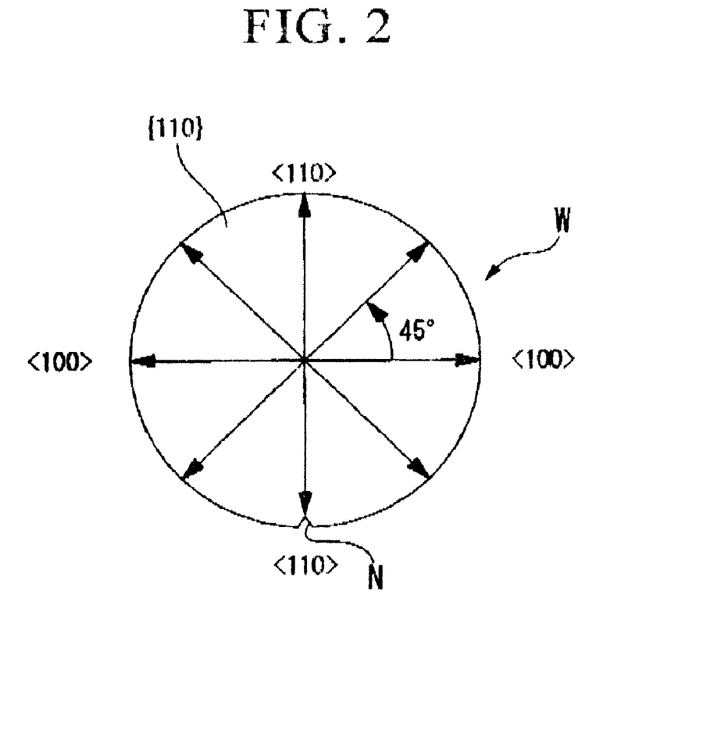
FIG. 2 is a schematic plan view of the epitaxial silicon wafer of the first embodiment of the present invention.
Figure 3:
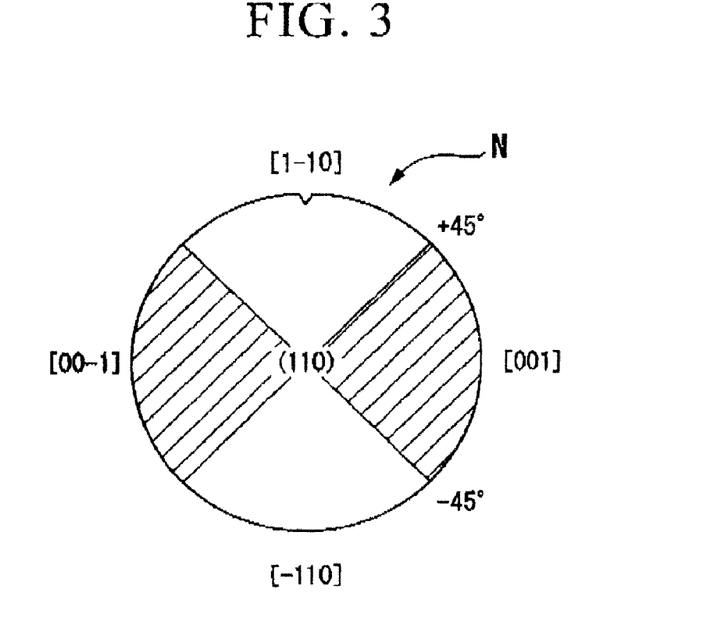
FIG. 3 is a schematic plan view of the epitaxial silicon wafer of the first embodiment of the present invention.
Figure 4:
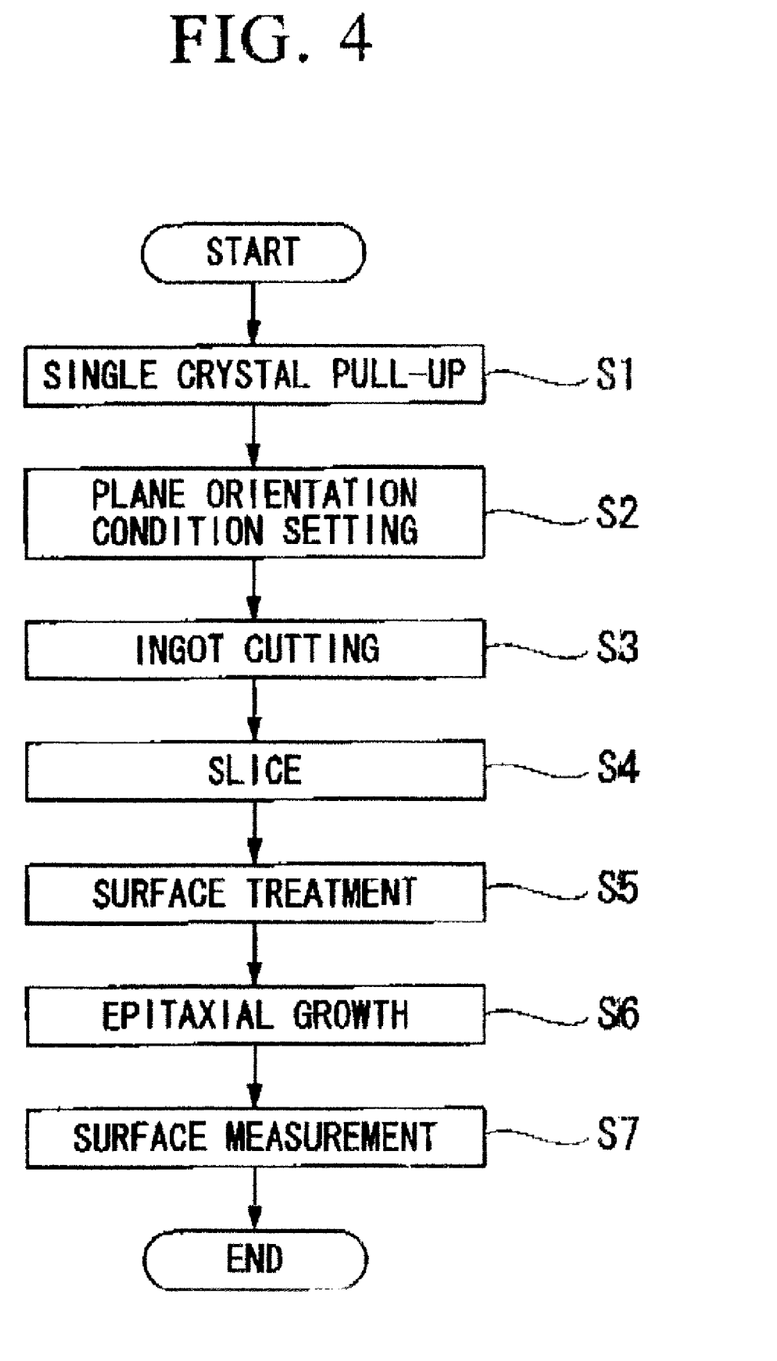
FIG. 4 is a flowchart of a fabrication method of the epitaxial silicon wafer of the first embodiment of the present invention.

FIG. 1 is a schematic perspective view for explaining an inclination angle azimuth and an inclination angle of an epitaxial silicon wafer in accordance with the present embodiment. FIGS. 2 and 3 are schematic plan views of the epitaxial silicon wafer of the present embodiment. FIG. 4 is a flowchart of a fabrication method of the epitaxial silicon wafer of the present embodiment. In the drawings, the symbol W represents a silicon wafer.

As illustrated in FIG. 2, the epitaxial silicon wafer of the present embodiment has a plane inclined from the {110} plane as the main surface. The inclination angle azimuth of the {110} plane is in the range of 0 to 45 degrees as measured from the <100> orientation that is parallel to the {110} plane toward the <110> direction. The inclination angle (off angle) of the {110} plane is set in the range of 0 to 10 degrees as measured from the {110} plane, more preferably in the range of 0 to 4 degrees.

More specifically, as illustrated in FIGS. 1 and 3, the epitaxial silicon wafer of the present embodiment has the plane W2 inclined from {110} plane W1 as the main surface. The inclination angle azimuth G1 of the {110} plane W1 is in the range as depicted by the slanted lines in FIG. 3. That is, the inclination direction G1 is set such that the angle ψ measured from the [001] or [00-1] orientation that is the <100> orientation parallel to the (110) plane W1 toward the [1-10] or [-110] direction is in the range satisfying a relationship of $0 \leq \psi < 45°$. The inclination angle ξ of the {110} plane W1 is in the range satisfying a relationship of $0 \leq \xi \leq 10°$ as measured from the {110} plane, more preferably in the range satisfying a relationship of $0 \leq \xi \leq 4°$.

That is, as illustrated in FIG. 3, the plane W2 having, as a normal line, the normal line MO' inclined by the inclination angle ξ from the normal line MO of the (110) plane W1 toward the inclination angle azimuth G1 is used as the in surface In the silicon wafer of the first embodiment, as shown in FIG. 3, the orientation flat or a notch N can be formed in [1-10] direction. The direction of a notch N is not fixed, and then in any crystal orientation it can be formed. Generally, it is formed in <110> direction (SEMI M1-1106). A notch N can be formed at the predetermined position in accordance with the set inclination angle azimuth G1.

As illustrated in FIG. 4, a fabrication method of such an epitaxial silicon wafer includes a single crystal pull-up process S1, a plane orientation condition setting process S2, an ingot cutting process S3, a slice process S4, a surface treatment process S5, an epitaxial growth process S6, and a surface measurement process S7.

In the single crystal pull-up process illustrated in FIG. 4, using the Czochralski (CZ) method, a seed crystal, i.e., a silicon single crystal is pulled up while making contact with a silicon solution, thereby obtaining a neck portion for preventing displacement of the seed crystal, a shoulder portion for enlarging the diameter of the seed crystal, a linear body portion for use as a wafer, and a reduced diameter portion (bottom portion). Here, the pull-up of the single crystal is performed such that the pull-up direction (i.e., the axial direction of the linear body portion) is identical to the normal direction MO shown in FIG. 1. Thus, the wafer sliced in the next process can have a plane inclined from the {110} plane as the main surface. Specifically, the plane of the seed crystal making contact with the silicon melt corresponds to the (110) plane.

The single crystal pulled up in the pull-up process S1 illustrated in FIG. 4 is subjected to the plane orientation condition setting process S2 of FIG. 4. That is, on the basis of the specification of the wafer as the final product, the angle ψ of the inclination angle azimuth G1 and the inclination angle ξ are set for the single crystal.

In this process, processing conditions for the ingot cutting process S3 and the slice process S4 are set, which will be described later.

In the ingot cutting process S3 of FIG. 4, the pulled-up single crystal is divided in the axial direction and surface treatments such as cylindrical grinding are performed so as to obtain a cylindrical ingot. At the same time, crystal orientation of the single crystal or the ingot is specified using analysis devices based on X-ray diffraction methods or light figure methods, and a notch N is formed at a position corresponding to the [1-10] orientation, for example.

When shaping the ingot, the curved surface (cylinder surface) of the linear body portion of the single crystal is subjected to the surface treatments such as grinding. At this time, the center line (center axis) of the ingot is set so as to be identical to the normal line MO of FIG. 1. Thus, the plane inclined from the {110} plane becomes the main surface of the wafer in the next slice process S4.

Figure 5:
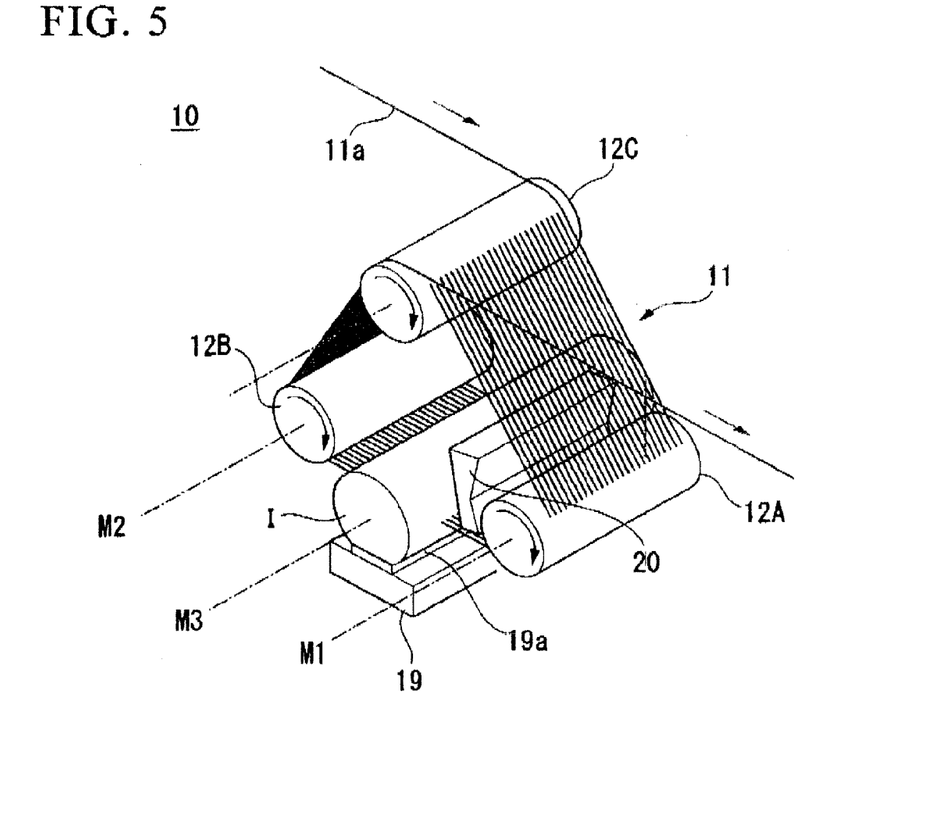
FIG. 5 is a perspective view for explaining a process of slicing the epitaxial silicon wafer of the first embodiment of the present invention.

FIG. 5 is a perspective view for explaining a process of slicing the epitaxial silicon wafer of the first embodiment of the present invention.

In the slice process S4 of FIG. 4, the ingot is sliced using a wire saw 10 so as to obtain a silicon wafer W.

The wire saw 10 is a device in which a long wire 13 is rolled into a coil around a plurality of groove rollers. As shown in FIG. 5, the wire saw 10 is used to cut the ingot I divided from single crystal silicon that was pulled up using the CZ method into a number of silicon wafers.

The wire saw 10 includes three groove rollers 12A, 12B, and 12C that form a triangle as seen from the front side of the drawing. Around the groove rollers 12A, 12B, and 12C, a wire 11a is wound parallel at regular pitches. As a result a wire array 11 is formed around the groove rollers 12A, 12B, and 12C. The wire array 11 can move over the groove rollers 12A, 12B, and 12C by a drive motor in a reciprocating manner. The midpoint between the two groove rollers 12A and 12B disposed in the lower side corresponds to an ingot cutting position at which the ingot I is cut by the wire array 11.

The ingot I is fixed to a lift base 19 for lifting the ingot I, and a carbon bed (slice base) is disposed between the ingot I and the lift base 19. On the upper portion on both sides of the ingot cutting position, a grind liquid supply unit 20 is disposed to continuously supply a grind liquid to the wire array 11. The groove rollers 12A, 12B, and 12C have a cylindrical shape, and their outer peripheries are covered with a lining member made of urethane rubber having a predetermined thickness. A wire groove is formed in the outer periphery of the lining member of each of the groove rollers.

The wire 11a is a piano wire having a diameter of 160 μm and is plated with Zn. The wire 11a is pulled out from a bobbin of a pull-out mechanism (not shown) so as to be wound over the groove rollers 12A, 12B, and 12C via a guide roller on the supply side. Then, the wire 11a is wound over a bobbin of a winding mechanism (not shown) via a guide roller on the pulling-out side. Rotating shafts of the bobbins are connected to corresponding output shafts of the drive motors. When the drive motors we driven in a synchronized manner, the bobbins are rotated and thus the wire 11a is moved in a reciprocating manner.

As shown in FIG. 5, in the wire saw 10, the bobbin of the pull-out mechanism is rotated by the drive motor while supplying the grind liquid from the grind liquid supply unit to wire array 11, and the wire 11a is supplied to the groove rollers 12A, 12B, and 12C. At the same time, the bobbin of the winding mechanism is rotated by the drive motor, and the wire 11a is wound over the groove rollers 12A, 12B, and 12C. At this time, the rotation directions of the bobbins are changed at a predetermined period so as to move the wire 11a in a reciprocating manner. In the course of the reciprocating movement of the wire array 11, the ingot I is pressed against the wire array 11. With this pressing, the ingot I is cut into a number of wafers. At the time of the reciprocating movement of the wire array 11, glass particles for grinding in the grind liquid scrub the bottom portion of the cutting groove along with the wire 11a of the wire array 11. As a result, the bottom portion is gradually cut off by the grinding action, and finally, a number of silicon wafers are obtained.

In the slice process S4 of the present embodiment, the axial lines M1 and M2 parallel to each other and disposed on both sides of the ingot cutting position and the axial line M3 of the ingot I are set so as to be identical to the normal lines MO and MO' as shown in FIG. 1. Thus, the wafer sliced in the next process can have a plane inclined from the {110} plane as the surface. Specifically, the ingot I is fixed to the lift base 19 while being placed on the carbon bed 19a in such a state that; the parallel axial lines M1 and M2 of the groove rollers 12A and 12B are identical to the normal line MO of FIG. 1; the axial line M3 of the ingot I is identical to the normal line MO' of FIG. 1; and the inclination angle azimuth G1 and G2 are parallel to the plane formed by the axial lines M1 and M2. In this case, the lift base 19 is configured so as to be movable in the direction of a normal line of the plane (which becomes parallel to the wire array 11 at the cutting position) formed by the parallel axial lines M1 and M2 of the groove rollers 12A and 12B.

Thereafter, the sliced silicon wafer is subjected to the surface treatment process S5; for example, various processes such as babeling, rapping, grinding, etching, or mirror grinding (polishing) are performed.

After the surface treatment process S5, in the epitaxial growth process S6, an epitaxial layer is grown on the silicon wafer surface.

In this case, as epitaxial growth conditions, for example, a film thickness of 1 to 6 μm (preferably 3 μm), a film forming speed of 1.5 to 3.5 μm/min (preferably 2.5 μm/min), and a temperature range of 1050 to 1200° C. (preferably at about 1130° C.) are used. Under such conditions, the epitaxial layer is grown.

During the period between the input of wafers and the completion of the epitaxial growth process, $H_2$ gas is continuously supplied to a furnace as the main gas. Before film forming gases such as TCS (trichlorosilane), $SiH_4$ (monosilane), $SiH_2Cl_2$ (dichlorosilane), $SiCl_4$ (silicon tetrachloride) are supplied to the epitaxial growth furnace, a hydrogen bake process for supplying hydrogen gas during a temperature incremental period or an HCl etching process based on hydrochloride gas may be performed.

According to the epitaxial silicon wafer and the fabrication method thereof of the present embodiment, it is possible to obtain a good surface roughness level of 0.15 nm or less in RMS. Also, it is possible to decrease the haze level which may cause a problem in the measurement using a laser-based surface inspection tool to be described later. Accordingly, it becomes possible to measure micro-size LPDs of 100 nm or less.

Second Embodiment

Hereinafter, an epitaxial silicon wafer and a fabrication method thereof according to a second embodiment of the present invention will be described with reference to the accompanying drawings. In the epitaxial silicon wafer and the fabrication method thereof of the present embodiment, the configurations of the plane orientation condition setting process S2, the ingot cutting process S3, and the slice process S4 are different from those of the first embodiment and the fabrication method thereof. Other configurations are the same as the first embodiment. Therefore, similar or identical components will be referenced by the same reference numerals, and descriptions thereof will be omitted.

Figure 6:
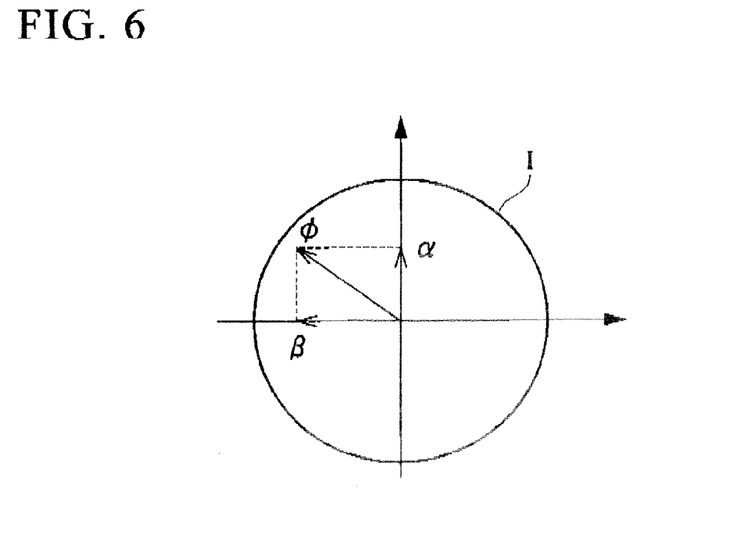
FIG. 6 is a view for explaining an X-ray diffraction method.
Figure 7:
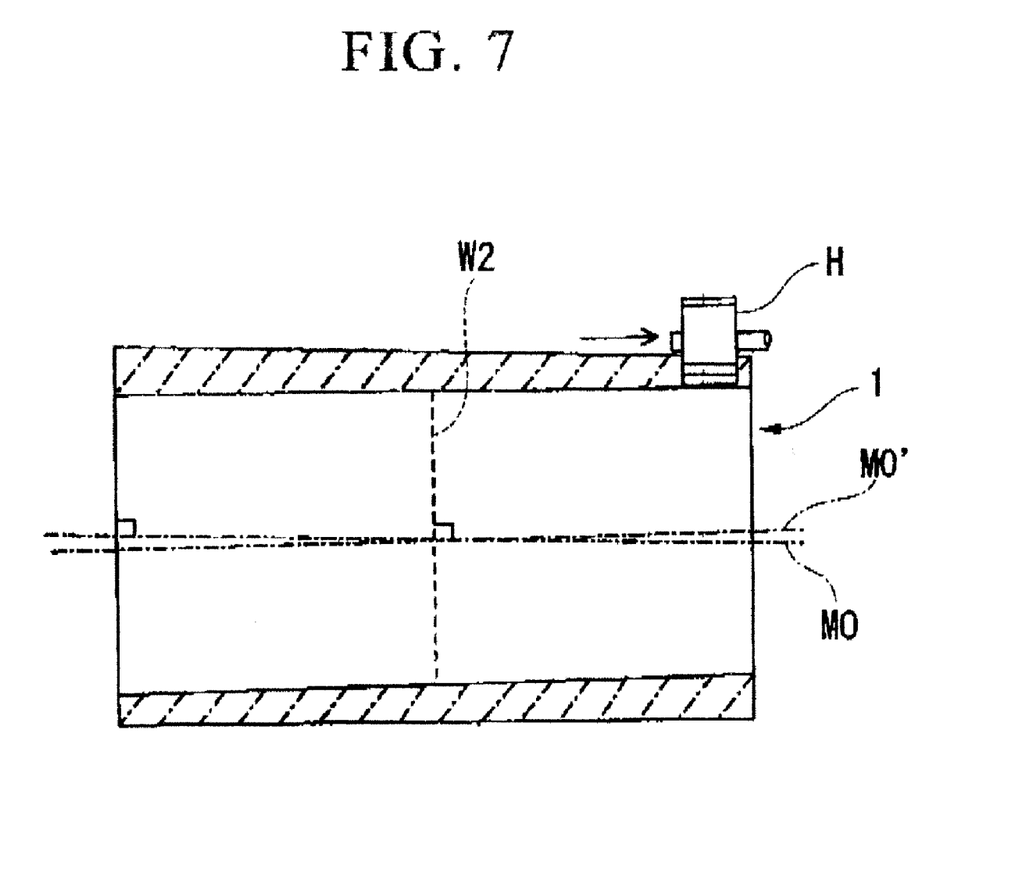
FIG. 7 is a schematic front view for explaining an ingot cutting process in accordance with a second embodiment of the present invention.

FIG. 6 is a view for explaining an X-ray diffraction method. FIG. 7 is a schematic front view for explaining an ingot cutting process in accordance with the present embodiment of the present invention.

In the ingot cutting process S3 of the present embodiment, the pulled-up single crystal is divided in the axial direction and surface treatments such as cylindrical grinding are performed so as to obtain a cylindrical ingot. At the same time, crystal orientation of the single crystal or the ingot is specified using analysis devices based on X-ray diffraction method or light figure methods, and a notch N is formed.

When shaping the ingot, the curved surface (cylinder surface) of the linear body portion of the single crystal is subjected to the surface treatments such as grinding. At this time, the center line (center axis) of the ingot is set so as to be identical to the normal line MO' of FIG. 1. Thus, the plane inclined from the {110} plane becomes the main surface of the wafer in the next process.

The X-ray diffraction method is a method of recording diffracted X-ray patterns or the intensity thereof, diffracted from the crystal lattice plane. In this diffraction method, the measurement of crystal orientation on the cutting plane is performed by an X-ray diffraction apparatus using a measurement tube known as a deflectometer. The diffractometer mainly includes an X-ray generating unit for generating X-rays, a goniometer for measuring a reflection angle of the X-rays, a measurement unit for measuring in intensity of the X-rays, and a control and calculating unit for controlling these elements and calculating measurement values.

In the case where the incident beams of X-rays irradiated from the X-ray generating unit, the reflected beams, and the normal line of the reflection surface are on the same plane, and the reflection intensity of the X-rays becomes the maximum, the relationship of $2d \sin\theta = n\lambda$, known as the Bragg condition is satisfied. Here, $\lambda$ is a wavelength of monochromatic X-rays being irradiated; d is a lattice spacing of reflection planes (h, k, l); $\theta$ is the Bragg angle; n is the order of reflection; and h, k, l are Miller indices. By using these conditions, an inclination of crystal orientation between the cutting plane and the reference crystal plane (110) is measured. First, a sample base is adjusted such that an angle between the cutting plane and the incident beams becomes the Bragg angle, and X-rays are irradiated to the target surface. Next, the measurement tube is rotated about the sample base, and a rotation angle $\Psi 1$ of the measurement tube is measured when the intensity of the X-rays becomes the maximum. Similarly, rotation angles $\Psi 2$, $\Psi 3$, and $\Psi 4$ of the measurement tube are measured when the sample base is rotated about the normal line of the cutting plane by 90, 180, and 270 degrees, respectively.

As illustrated in FIG. 6, the crystal orientation $\alpha$ of the cutting plane and the crystal orientation $\beta$ of the reference crystal plane (110) on the XY axis, that is, inclinations $\alpha$ and $\beta$ of the cutting plane and the (110) plane relative to the ingot pull-up axis (the rotation center axis of the cylindrical processing or the crystal orientation of the front end plane of the ingot I) can be expressed by Formulas 1 and 2.

$$\alpha = (\Psi 1 - \Psi 3)/2 \quad \text{Formula 1}$$

$$\beta = (\Psi 2 - \Psi 4)/2 \quad \text{Formula 2}$$

A maximum inclination $\Phi$ of the crystal orientation between the cutting plane and the reference crystal plane (110) can be calculated by Formula 3.

$$\tan^2\Phi = \tan^2\alpha + \tan^2\beta \quad \text{Formula 3}$$

If the measured angle values $\alpha$ and $\beta$ are 5 degrees or less, Formula 3 can be simplified as Formula 4.

$$\Phi^2 = \alpha^2 + \beta^2 \quad \text{Formula 4}$$

In this way, the measurement of the crystal orientation of the cutting plane is finished. Next, the crystal orientation MO' orthogonal to the reference crystal plane W2 calculated on the basis of the measurement values is measured. Thereafter, as illustrated in FIG. 7, the cylindrical grinding process is performed using a grinding wheel H for cylindrical grinding in the axial direction MO' extending in the same direction as the crystal orientation. At this time, the axis MO' is inclined from the current center axis (pull-up axis) MO of the ingot I toward the XY directions by the angles $\alpha$ and $\beta$, respectively. The angles $\alpha$ and $\beta$ are used as $\psi$ and $\xi$ in the plane orientation condition setting process S2. After the cylindrical grinding process, the ingot I comes to have a diameter of about 300 mm. Thereafter, the cylindrically ground ingot I is subjected to a notch process and the fixed to the carbon bed (slice base) 19a shown in FIG. 5.

In the slice process S4 of the present embodiment, the axial lines M1 and M2 parallel to each other and disposed on both sides of the ingot cutting position and the axial line M3 of the ingot I are set so as to be identical to the normal line MO' as shown in FIG. 1. Thus, the wafer sliced in the next process can have a plane inclined from the {110} plane as the main surface. Specifically, the ingot I is fixed to the lift base 19 while being placed on the carbon bed 19a in such a state that: the parallel axial lines M1 and M2 of the groove rollers 12A and 12B are identical to the normal line MO' of FIG. 1; the axial line M3 of the ingot I is identical to the normal line MO' of FIG. 1. In this case, the lift base 19 is configured so as to be movable in the direction of a normal line of the plane (which becomes parallel to the wire array 11 at the cutting position) formed by the parallel axial lines M1 and M2 of the groove rollers 12A and 12B.

With such an arrangement, it becomes possible to slice the silicon wafer so as to have the plane W2 as the main surface.

In the plane orientation condition setting process S2 of the present embodiment, the angles are preset for the ingot cutting process S3 and the slice process S4.

In the single crystal pull-up process S1, it may be possible to manufacture the pull-up axis to be identical to the normal line MO'. Moreover, pulling up is carried out in the single crystal pushup process S1 in the conditions where the pull-up axis is set in greater or smaller than the normal line MO', after that, by carrying out the process shown in the slice process S4 of the first embodiment, it is possible to manufacture the wafer having few loss of silicon and corresponding to the great inclination angle ξ.

In the embodiments described above, although the slice process S4 was performed using the wire saw, other slice means can be used if it is possible to set the crystal orientation in the same manner as in the case of the present invention. Regarding the wire saw, it is obvious that even if the constitution is different from the above constitution, any constitution can be adopted when the crystal direction can be set.

Regarding the X-ray diffraction too, the constitution except the above constitution can be adopted.

EXAMPLES

Hereinafter, examples of the present invention will be described.

Figure 8:
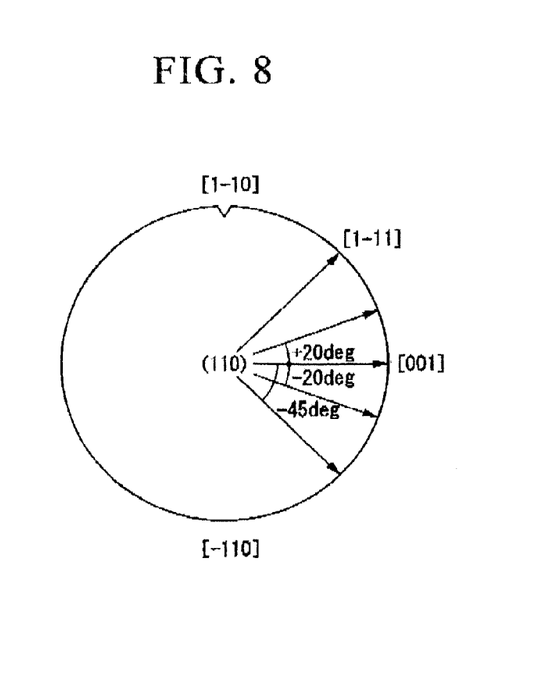
FIG. 8 is a view for explaining a crystal orientation related to Examples of the present invention.
Figure 9:
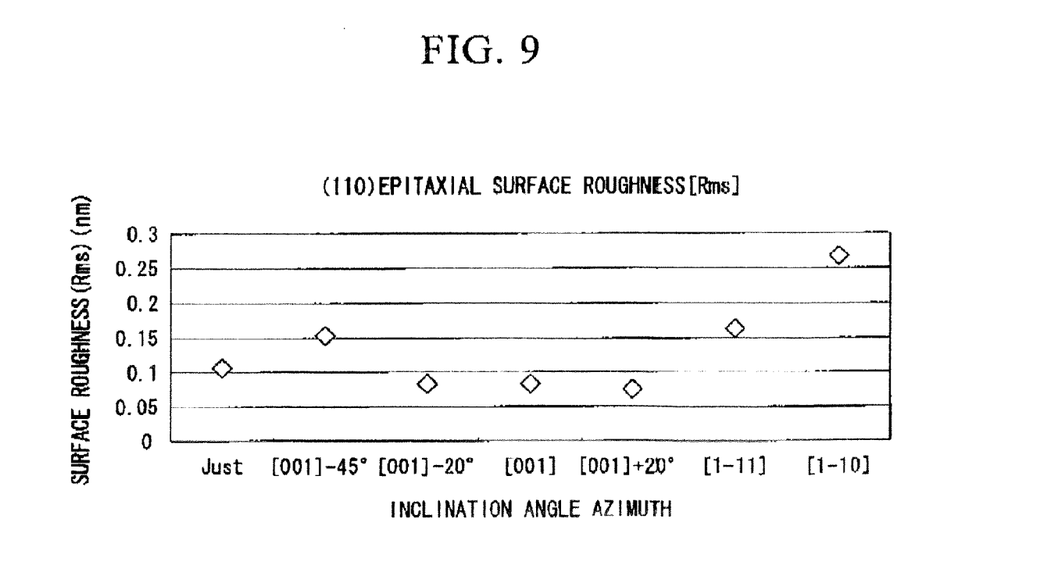
FIG. 9 is a graph showing a measurement result of the surface roughness related to Examples of the present invention.

In the same manner as in the case of the embodiments of the present invention, epitaxial silicon wafers were prepared by pulling up a silicon single crystal having a diameter of 300 mm and having a (110) plane as the main surface. The surface roughness was inspected while changing an inclination angle azimuth ψ with an inclination angle ξ of 0.5 degrees. The crystal orientations and the results thereof are shown in FIGS. 8 and 9.

In this case, as the epitaxial growth conditions in the epitaxial growth process S6, a film for gas of TCS (trichlorosilane), a film thickness of 3 μm, a film forming speed of 2.5 to 3.5 μm/min, and a temperature of 1130° C. were used. Under such conditions, the epitaxial layer was grown.

In the setting of a slice angle when the wafer is sliced from the silicon ingot using a wire saw, the wafer was sliced such a setting that a crystal axis direction of the silicon ingot was inclined from a wire roll by the above inclination angle and inclination angle azimuth.

The inclination angle azimuth ψ of the silicon wafers and LPDs were measured using a laser-based surface inspection tool. The inspection results are shown in Table 1.

As an inspection mode of the laser-based surface inspection tool, for example, of the SP-2 (KLA-Tencor Corporation), by selecting high productivity conditions from HTO (High Throughput Oblique Mode) mode and by selecting detect channel from wide, narrow, or composites thereof, it is possible to measure LPDs of 65 nm or more.

TABLE 1

| Inclination Angle Azimuth | 65 nm LPD | Note |
|---|---|---|
| Just | Measurable | |
| [001] – 45° | Not measurable | Haze-related Noise Present |
| [001] – 20° | Measurable | |
| [001] | Measurable | |
| [001] + 20° | Measurable | |
| [1-11] | Not measurable | Haze-related Noise Present |
| [1-10] | Not Immeasurable | Haze-related Noise Present |

From these results, the following conclusion can be obtained. That is, when the inclination angle azimuth ψ was in the range satisfying a relationship of 0<ψ<45, it was possible to obtain a surface roughness of 0.15 nm in RMS. Also, it became possible to detect LPDs of 100 nm or less, and particularly to detect LPDs in the order of 65 nm.

The surface roughness did not change much when the inclination direction ψ was in the range of 0 to 45 degrees. However the surface roughness was abruptly degraded when inclination direction ψ began to exceed 45 degrees.

In addition, the surface roughness was measured while changing the orientation of the inclination angle azimuth relative to the <100> orientation. The measurement results showed that the surface roughness of the (110) plane became the minimum when the inclination angle azimuth was in the range of –20 and +20 degrees (including inclination angle 0 (Just) angle). Moreover, when the inclination angle azimuth was 45 degrees, the surface roughness was degraded to 0.15 nm or slightly, more in RMS (0.15 nm corresponding to the (100) surface roughness).

What is claimed is:

1. An epitaxial silicon wafer in which an epitaxial layer is grown on a silicon wafer comprising a surface having a normal line MO' inclined by an inclination angle ξ from a normal line MO of a {110} plane toward an inclination angle azimuth ψ,
    wherein in the silicon wafer for growing the epitaxial layer thereon, the inclination angle azimuth ψ is in the range of 20 degrees or more and 30 degrees or less as measured from an <100> orientation parallel to the {110} plane toward an <110> orientation direction;
    the surface of the epitaxial silicon wafer has LPDs (light point defects) having a size of 65 nm or more and 100 nm or less; and
    the LPDs are detectable via roughness of the surface of the epitaxial silicon wafer by a laser-based surface inspection tool.

2. The epitaxial silicon wafer according to claim 1, wherein the inclination angle ξ is more than 0 degrees and less than or equal to 10 degrees as measured from the {110} plane.

* * * * *